United States Patent [19]
Karlovich

[11] Patent Number: 5,230,143
[45] Date of Patent: Jul. 27, 1993

[54] EXTRACTOR FOR IC SOCKET ASSEMBLY

[75] Inventor: Robert J. Karlovich, Los Gatos, Calif.

[73] Assignee: Foxconn International, Inc., Sunnyvale, Calif.

[21] Appl. No.: 904,843

[22] Filed: Jun. 26, 1992

[51] Int. Cl.$^5$ .............................................. H05K 13/04
[52] U.S. Cl. ........................................ 29/764; 29/758
[58] Field of Search ................. 29/764, 741, 758; 294/99.2, 106

[56] References Cited

U.S. PATENT DOCUMENTS

| | | | |
|---|---|---|---|
| 3,896,533 | 7/1975 | Ullman et al. | 29/764 X |
| 4,521,959 | 6/1985 | Sprenkle | 29/764 X |
| 4,583,287 | 4/1986 | McDevett et al. | 29/764 X |
| 4,666,199 | 5/1987 | Cheh | 294/106 |
| 4,800,647 | 1/1989 | Guyer | 29/764 X |
| 4,866,838 | 9/1989 | Porter | 29/764 X |
| 4,873,761 | 10/1989 | Korsunsky et al. | 29/741 |
| 5,062,201 | 11/1991 | Long | 29/741 |

Primary Examiner—Carl E. Hall

[57] ABSTRACT

An extractor (50) comprises a table-like main body (52) having a plate (54) and four legs (56) extending downward from the four corners of the plate (54), respectively. Disposed between every two adjacent legs (56) is a wall (58) extending downward from an edge of the plate (54). A lengthwise and horizontal slot (68) is formed along each wall (58). A hole (72) is positioned at the center of the plate (54). An actuator (75) includes a bar (76) axially moveable within the hole (72). A knob (80) is positioned at the top of the bar (76) and above the plate (54). An actuating block (78) is positioned at the bottom of the bar (76) and below the plate (54). The slot (68) can retain a cover (24) of an IC socket assembly (20) in the main body (52) and the actuator (75) can release the cover (24) of the socket assembly (20) from the main body (52).

13 Claims, 7 Drawing Sheets

EXTRACTOR FOR IC SOCKET ASSEMBLY

BACKGROUND OF THE INVENTION

1. Field of The Invention

This invention generally relates to extraction tools for removal of a cover from an IC socket housing, particularly, to an extractor which is for use with an IC socket having a cover capable of vertical removal from the housing.

2. The Prior Art

An IC socket assembly is adapted to receive an integrated circuit chip package therein for connection with a PC board on which the socket assembly is seated. Typically, the socket assembly comprises a cover and a mounting housing having a plurality of contacts therein to contact leads of the IC package. In some situations, the cover is expected to be removed from the housing to have a new IC package replace the original one. There are basically two different type covers in which one type is hinged with the housing as disclosed in U.S. Pat. Nos. 4,758,176, 4,969,828, 5,000,696 and 5,120,238; and the other type is fastened to the housing from the top and is capable of vertical removal from the housing completely as disclosed in U.S. Pat. Nos. 4,547,031, 4,872,845, 4,968,259 and 5,073,116. Generally speaking, the latter needs to use an extraction tool to release the cover from the housing because most latch engaging portions are so tiny and hidden in a crowded space that it is uneasy to operate manually. As known till now, the traditional extraction tool used in IC socket assembly is of a clamp type and has generally a dimension of 5"×3"×1" which intends to provide a pair of sufficient long arms of force, i.e. 5", and a sufficient distance, i.e. 3", between two opposite operation ends of the arms so that the operator can easily press the clamp type extraction tool to detach the cover from the housing.

A tiny extraction tool is desired which can easily be operated, and occupy little space when carried or stored.

Accordingly, the present invention uses a circumferential socket type extractor to replace the conventional clamp type extraction tool. Because different housings may have their own different covers, the present invention is preferably used with the IC socket connector which is disclosed in copending application Ser. No. 07/843,428 assigned to the same assignee as the present application.

SUMMARY OF THE INVENTION

A present embodiment of the present invention comprises a table-like main body having a plate and four legs extending downward from the four corners of the plate, respectively. Disposed between every two legs is a wall extending downward from an edge of the plate. A lengthwise and horizontal slot is formed along each wall. A hole is position at the center of the plate. An actuator includes a bar received and axially moveable in the hole, a actuating block positioned at the bottom of the bar and below the plate, and a knob positioned at the top of the bar and above the plate. The slots can retain a cover of an IC socket assembly in the main body and the actuator can release the cover of the socket assembly from the main body.

Figure 1:
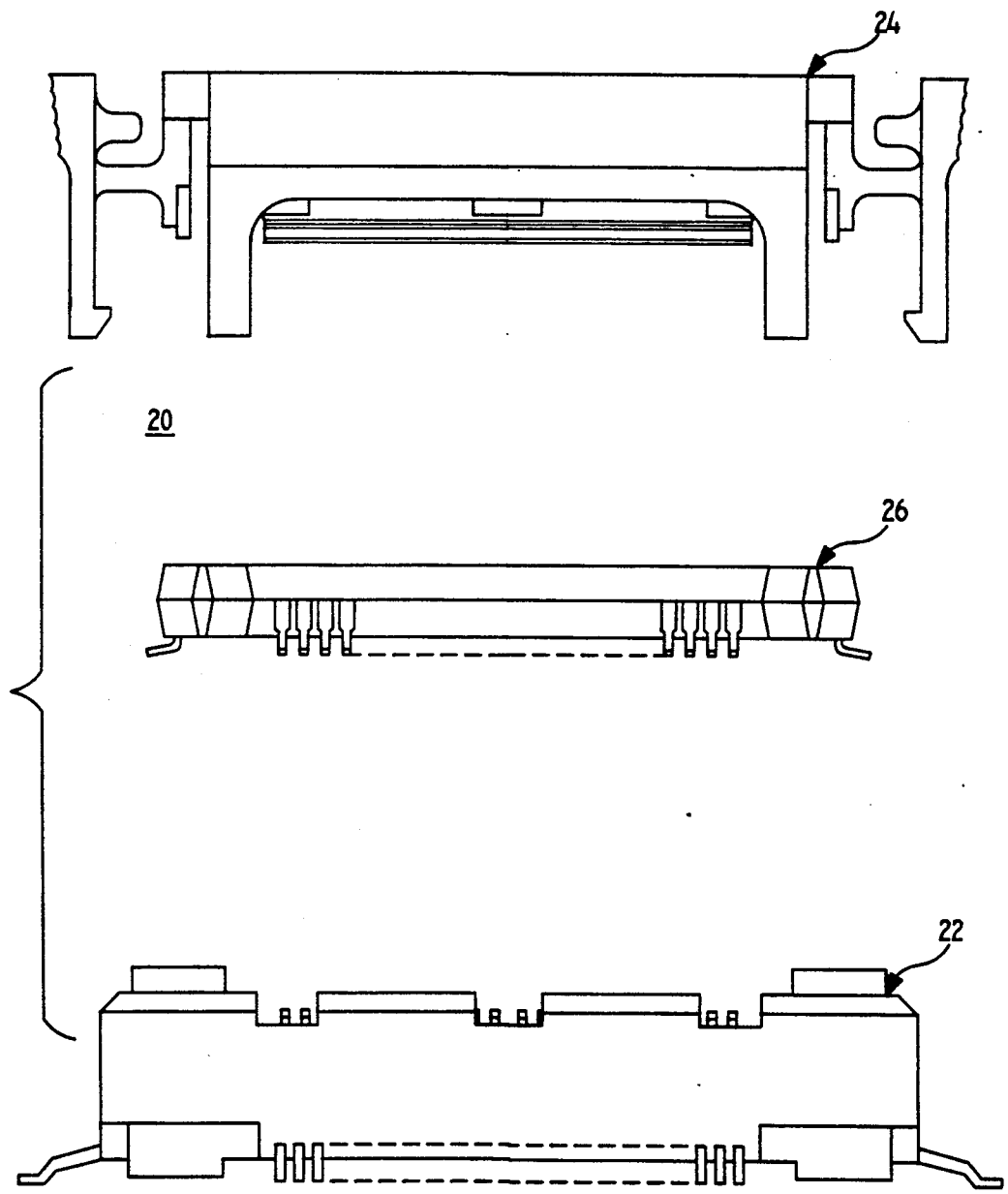
FIG. 1 is an exploded side view of the components that comprise the electrical socket assembly and IC package therein.

FIG. is an exploded top perspective view of the socket assembly of FIG. 1.

Figure 2:
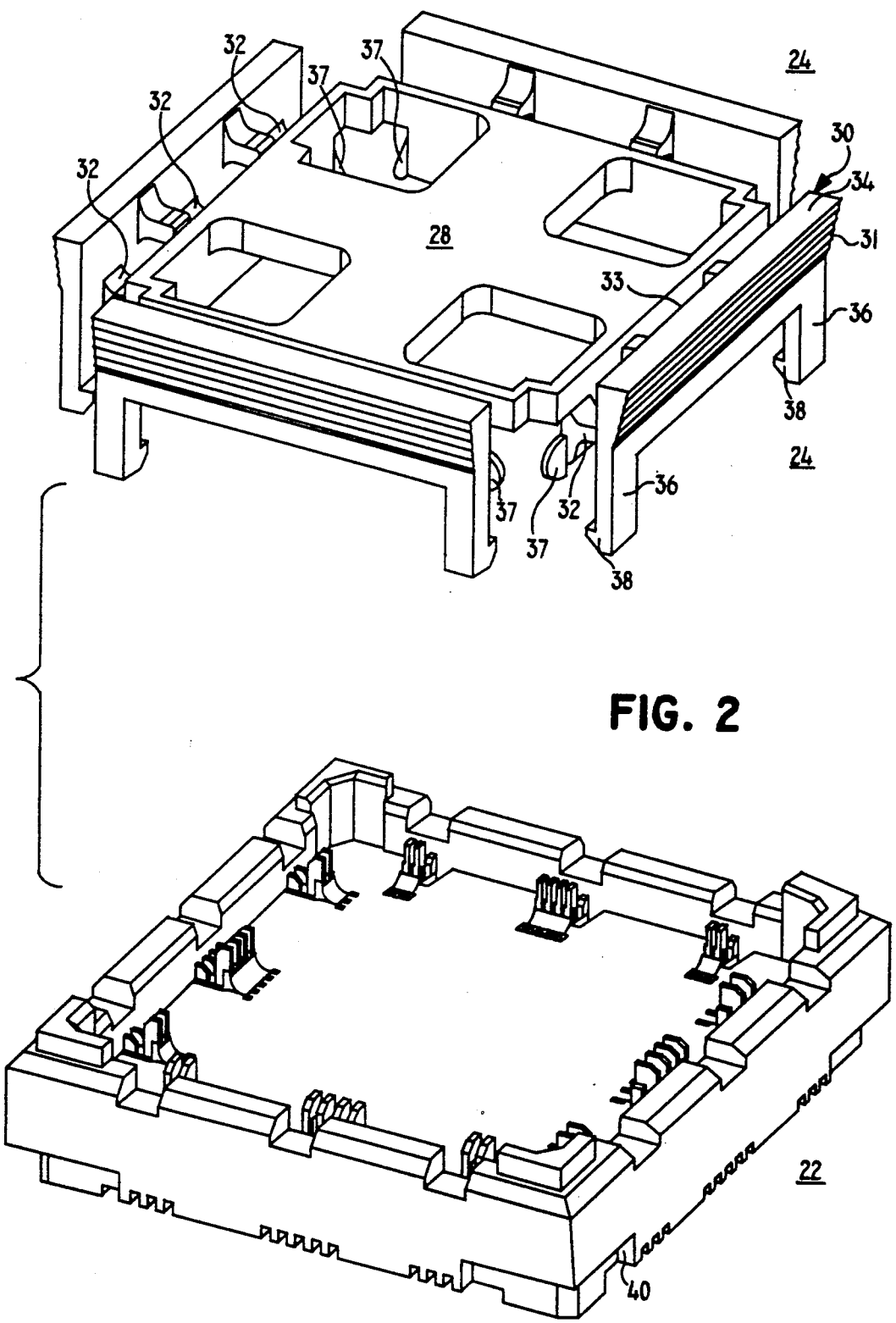
Figure 3A:
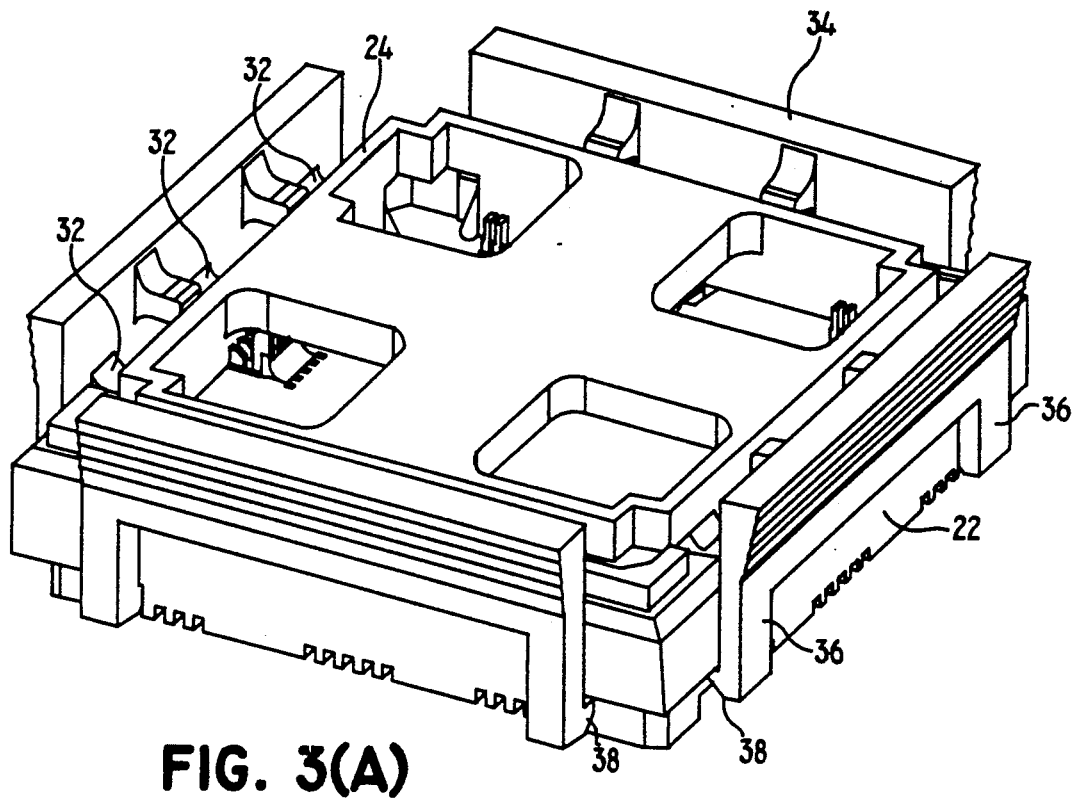

FIG. 3(A) is a top perspective view of the assembled socket assembly of FIG. 2.

Figure 3B:
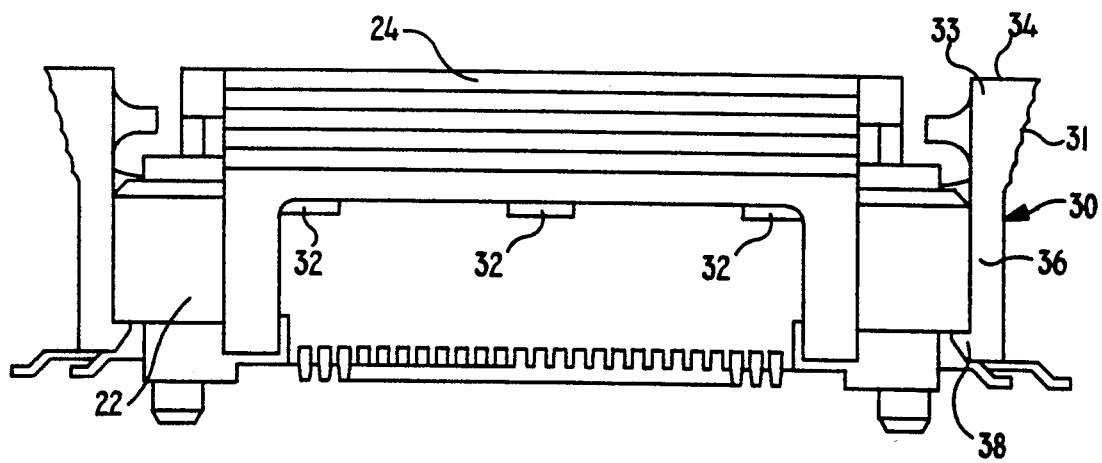

FIG. 3(B) is a side view of the assembled components of FIG. 1.

Figure 4A:
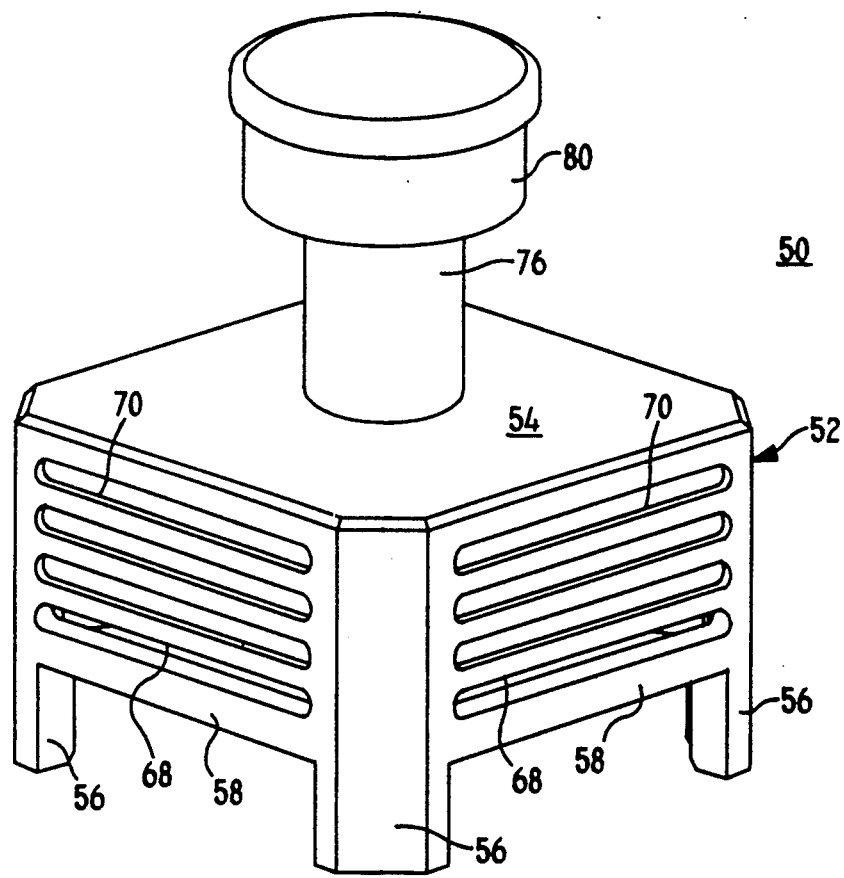

FIG. 4(A) top perspective view of an extractor in accordance with present invention.

Figure 4B:
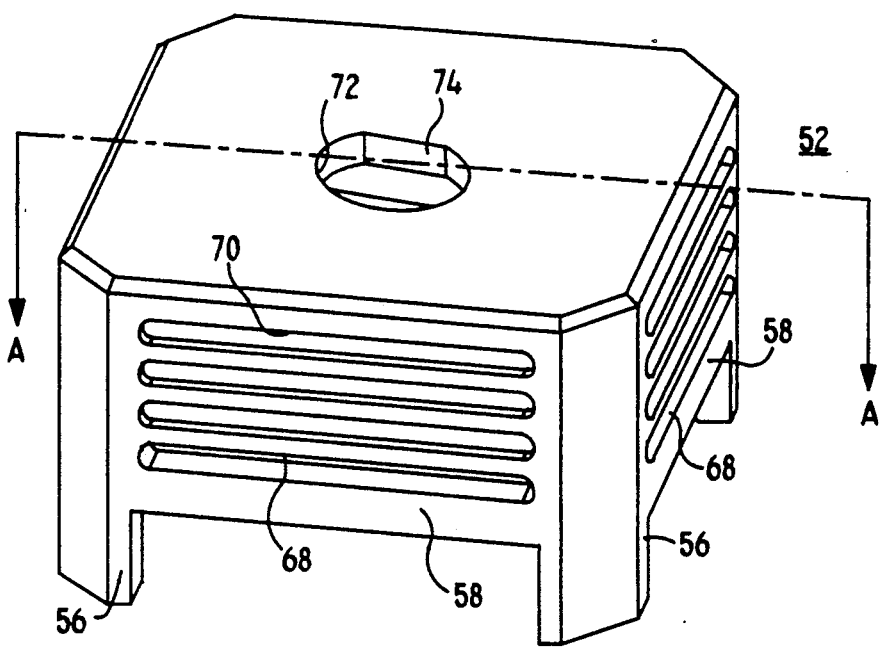

FIG. 4(B) is a top perspective views of a main body of the extractor of FIG. 4(A).

Figure 4C:
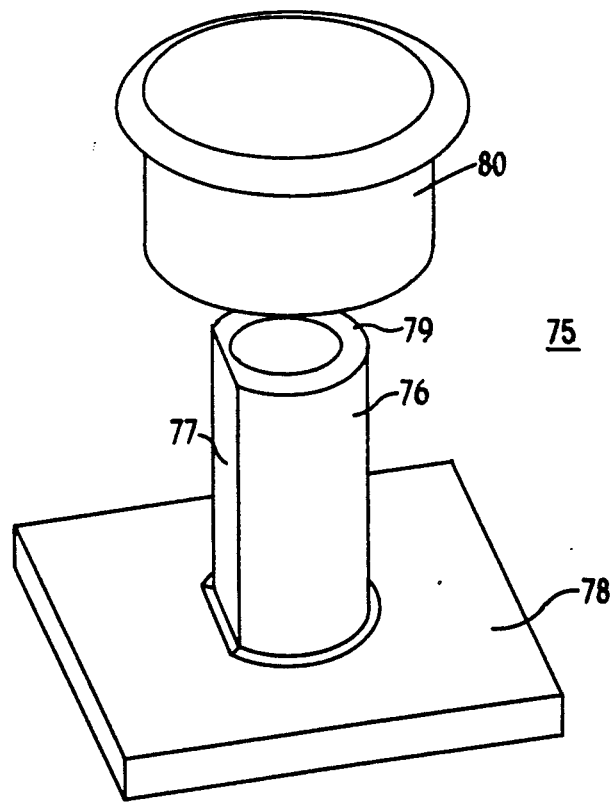

FIG. 4(C) is an exploded top perspective view of an actuator of the extractor of FIG. 4(A).

Figure 5:
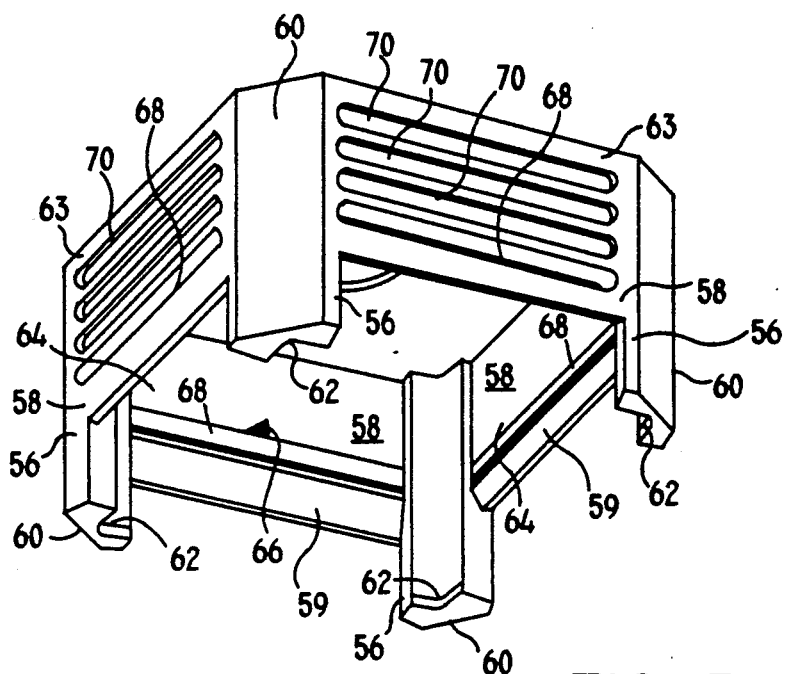

FIG. 5 is a bottom perspective view of the main body of FIG. 4(B) to illustrate the inner portions of the walls and the legs of the main body.

Figure 6:
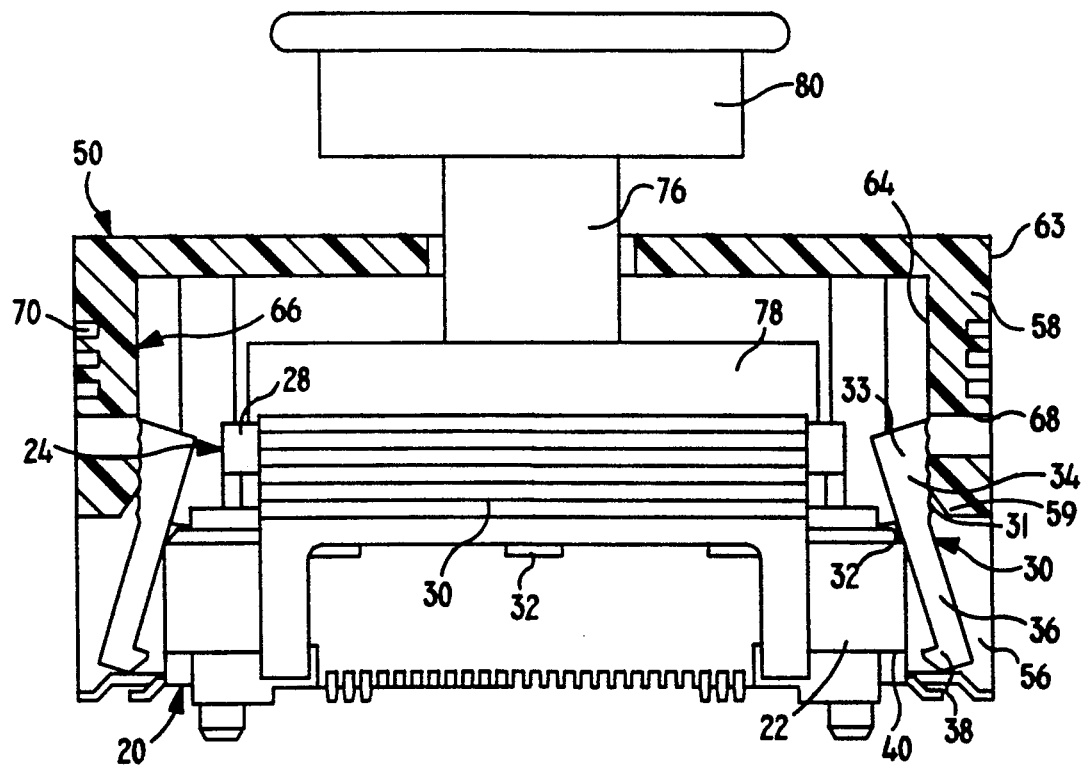

FIG. 6 is a side view of the components that comprise the assembled extractor of FIG. 4(A) of which the main body is cut along line A—A in FIG. 4(B) to show the engagement between the slot of the extractor and the top portion of the latch, and the assembled socket assembly having the IC package therein of FIG. 3(B) to illustrate how the extractor releases the latches of the cover from the housing and retains the cover therein.

Figure 7:
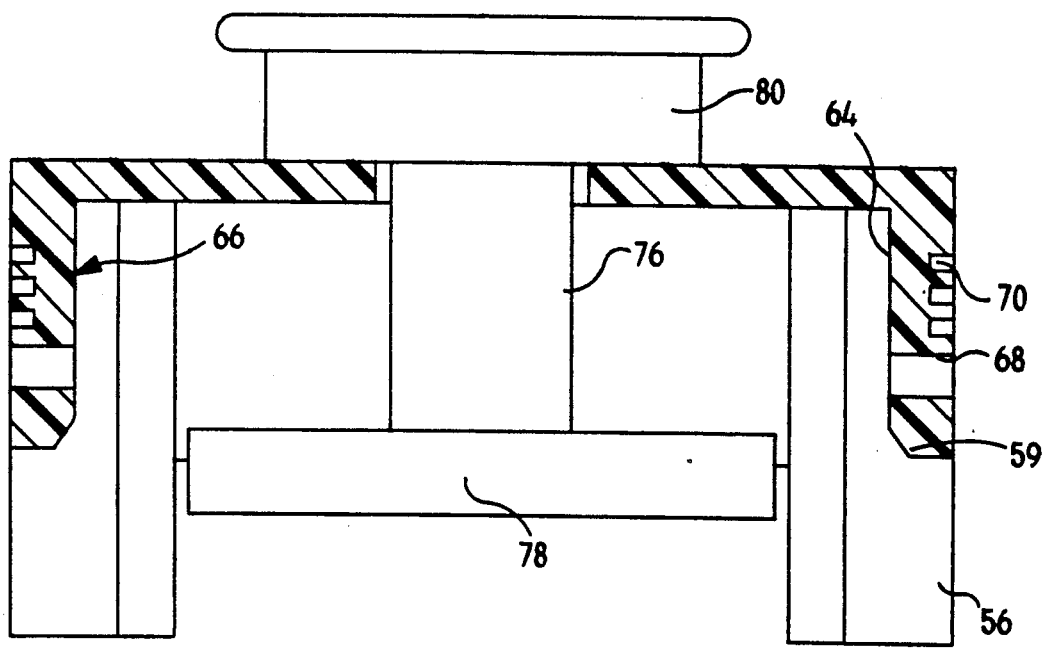

FIG. 7 is a side view of the extractor with the cover of FIG. 6 to illustrate how to remove the cover from the extractor.

DESCRIPTION THE INVENTION

The present invention comprises a novel device which permits "one push-down" action to remove the cover of the IC socket from the housing. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiments shown, but is to be accorded with the widest scope consistent with the principles and features disclosed herein.

It will be noted here that for a better understanding, like components are designated by like reference numerals throughout the various figures. FIGS. 1-3 show the socket assembly which the subject extractor shown in FIGS. 4 and 5 acts on. Attention is now directed to FIG. 1, where a typical Plastic Quad Flat Pack (PQFP) socket assembly, generally designated 20, comprises a housing 22 and a cover 24 to sandwich a PQFP 26 therebetween. The detailed basic structure of this socket assembly 20 has been disclosed in copending application Serial No. 07/843,248 assigned to the same assignee as this invention.

As shown in FIG. 2, the cover 24 comprises a main surface 28 and four latches 30, one per each side of the cover 24, integral from the main surface 28. Each latch 30 includes three fulcrums 32 connected to the main surface 28. A lever bar 34 is formed above the three fulcrums 32. Two legs 36 are integrally formed and depend downward from the lever bar 34. With the lever bar 34 above the fulcrums 32 and the legs 36 below the fulcrums 32, the lever bar 34 together with the fulcrums 32 and the legs 36 act properly as a lever. A latch protrusion 38 is integrally formed on the end of each leg 36 which can physically snap a detent 40 located at a corner of the housing 22 to couple the cover 24 onto the housing 22 (as shown in FIGS. 3(A) and 3 (B)).

To remove the cover 24 from the housing 22, by lightly applying an inward pressure to the lever bars 34 on the opposing sides of the housing 22, each lever bar 34 moves inwardly. Because the legs 36 are integrally formed on the lever bar 34, torque is applied to the legs 36. Because the legs 36 depend below the fulcrums 32 whereas the lever bar 34 depends above the fulcrums 32, this torque causes the legs 36 to move outwardly from. Consequently, this outward motion allows the latch protrusions 38 to clear the indents 40 and allows the cover 24 to be slipped off the mounting housing 22.

Different from what is taught in the aforementioned co-pending application, the present invention introduces an extractor 50 which can easily and promptly release the cover 24 from the housing 22 in place of manual operation. Referring to FIGS. 4(A)-4(C), the subject extractor 50 comprises a table-like main body 52 including a plate 54 and four legs 56 rigidly and integrally extending downward from the four corners of the plate 54, respectively. Disposed between every two legs 56 is a wall 58 rigidly extending downward from an edge of the plate 54 to a position near one-third of the leg's length from the free end of the leg 56.

Also referring to FIG. 5, each leg 56 has a chamfer 60 at its outer corner, and a right angle recess 62 at the opposite corner. The configuration defined among these four recess 62 is a generally square shape which complies with the outer profile of the housing 22 of the socket assembly 20. The four recesses 62 on the four corners together with the inner surfaces 64 of the four fixed walls 58 define a generally square fixed opening 66 to receive the cover 24 of the socket assembly 20 therein.

To facilitate the reception of the cover 24 in the opening 66, each wall 58 has on the inner surface 64 a tapered section 59 extending inwardly from the outer edge. A lengthwise and horizontal slot 68 is formed along each wall 58. In this embodiment, the slot 68 extends from the inner surface 64 to the outer surface 63, i.e. through the whole thickness of the wall 58, in consideration of easy manufacturing. It will be appreciated that it is not necessary for the slot 68 to be open to the outside. Optionally, to facilitate handling by hand, a plurality of grooves 70 side by side extend on the outer surface 63 of each wall 58 in parallel to the slot 68 but do not communicate with the inside opening 66. It can also be appreciated that these grooves 70 can be replaced by other knurled surfaces for the same purpose.

Referring back to FIGS. 4(B) and 4(C), defined at the center of the plate 54 is a hole 72 which has a generally circular shape with a flat section 74 for anti-rotation of a bar 76 of an actuator 75 received therein. The bar 76 has a corresponding flat section 77 accompanying the rest circular contour to be conformable to the hole 72 and is axially moveable in respect to the hole 72. An actuating block 78 is disposed at the bottom of the bar 76 to forcibly push the cover 24 out therefrom. A knob 80 is positioned at the top of the bar 76. In this embodiment, the knob 80 has a down-facing annular recess (not shown) to receive an up-facing annular end 79 at the top of the bar 76 for combining the knob 80 to the bar 76. FIG. 4(A) shows an assembled extractor 50 wherein the actuator 75 is in an upper position and the actuating block 78 is positioned within the opening adjacent the plate 54 of the main body 52.

In operation, referring to FIG. 6, the extractor 50 moves downward to enclose the socket assembly 20 from the top until its legs 56 abut against the board (not shown) on which the socket assembly is mounted. Because the lever bar 34 of the latch 30 is in form of a stepped wedge 31 which has a thicker top portion 33 and the contour defined by the top portions 33 of the four lever bars 34 is somewhat larger than that defined by the four inner surfaces 64 of the wall 58, the top portions 33 of the latch 30 will be gradually inwardly biased by the movement along the tapered sections 59 of the walls 58 upon engagement occurring thereof. Obviously, as aforementioned, the torque resulting from the inwardly movement of the lever bar 34 and acting on the fulcrums 32 causes the legs 36 to move outwardly. Consequently, this outward motion of the legs 36 allows the latch protrusions 38 clear the corresponding indents 40 of the housing 22 and allows the cover 24 to be slipped off the mounting housing 22.

One important feature of the present invention is to provide a proper gripping means to grasp and detach the cover 24 from the housing 22 when the latch protrusions 38 of the cover 24 are completely disengaged from the corresponding indents 40 due to the occurring torque and the extractor 50 is ready to be lifted up. In this embodiment, the slots 68 function as an effective gripping means. As shown in FIG. 6, when the extractor 50 is closely seated on the board (not shown) to which the housing 22 of the socket assembly 20 is also mounted, because of confrontation with the slot 68, the laterally protruding top portion 33 of each lever bar 34 will be sprung outwardly, and partially embedded within the slot 3 of the corresponding wall 58 by the preloaded spring force resulting from the deflection of the latch 30. In this state, the latch protrusions 38 are still disengaged from the indents 40 and the cover 24 is fittingly retained within the opening 66 of the extractor 50 by the engagement between the top portion 31 of each lever bar 34 and the slot 68 of each wall 58. It can be contemplated that in the latch 30 the thicker top portion 33 accompanying the stepped wedge 31 is not intended or allowed to be dropped out of the slot 68 because the latch 30 is in a preloaded state at this stage.

Accordingly, associated with the extractor 50, the cover 24 of the socket assembly 20 can leave the housing 22 when the extractor 50 is upwardly moved from the housing 22. Then, as shown in FIG. 7, the bar 76 is pushed down by a force applied to the knob 80 so that the actuating block 78 at the other end pushes down the cover 24 retained within the opening 66. In this condition, the top portion 3 of each latch 30 cannot help moving downward in relation to the extractor 50 to get free from the slot 68 by the relative movement along the stepped wedge 31. It can be understood that in the process of the release of the cover 24 from the extractor 50 the lever bar 34 of the latch 30 is inwardly compressed to have the thicker top portion 33 be able to clear the slot 68 and successively move along the inner surface 64 of the wall 58 and the following tapered section 59 until it completely set free from the extractor 50.

It is noted that the actuator 75 can move axially and downward relative to the hole 72 until the knob 80 abuts against the plate 54. At that time, the block 78 has already pushed the cover 24 out of the extractor 50.

It is also appreciated that the extractor 50 in the present invention conveniently needs only one hand to operate. In this situation, the extractor 50 can first be held by at least two fingers of a hand on at least two opposite walls 58 of the extractor 50 and can catch the cover 24; i.e. the top portions 33 of the four lever bars 34 of the cover 24 respectively engage the slots 68 of the walls 58 of the extractor 50. Then, the extractor 50 is moved upwardly to be positioned in another place, and by using an additional finger to press down the knob 80, the actuating block 78 accompanied with the bar 76 is moved downward to expel the cover 24 from the extractor 50. In this embodiment, the PQFP 26 accompanied with the cover 24 is simultaneously removed out of the housing 22 by means of the hook portion 37 of the cover 24 and will be in a later time taken out of the cover 24. As a result, a new PQFP can disposed in the housing 22 in place of the original one and fastened by the original cover 24 which is reloaded on the housing 22. Alternatively, in other embodiments the PQFP may not move with the different type cover 24 but remains within the housing 22 when the cover 24 is removed from the housing 22. In that situation, the replacement of the PQFP occurs directly in the housing 22 itself. Anyhow, as aforementioned, it is easy and simple for any operator to use the present invention to extract the cover of the corresponding socket assembly.

It can be understood that the dimension of the extractor in the present invention is only required to be somewhat larger than that of the socket assembly 20. In fact, the dimension of the main body 52 of the extractor 50 in the present embodiment is only 5/4"×5/4"×⅜. This tiny size makes it convenient to operate, carry or take in the extractor 50.

Although in this embodiment the extractor 50 has four slots in four walls respectively, it is contemplated that the shape of the extractor and the number of the slot therein should be conformable to the corresponding portion of the cover of the socket assembly. For example, only two slots in two opposite walls are required if only two opposite latches are used with the cover of the socket assembly.

It is also noted that a coil spring may be disposed around the bar 76 and between the plate 54 and the knob 80 so that the actuator 75 can be retained in the upper position, as shown in FIG. 4(A), by the spring pressure. This optional design only provides the extractor of this embodiment with a stable situation; i.e. the actuator 75 does not move axially at random that it may be preferred by some critical users. Of course, the coil spring can be installed between the block 78 and the plate 54 for the same purpose, alternatively.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims:

What is claimed is:

1. An extractor for an IC socket assembly which includes a cover and a housing to sandwich an IC package therebetween, said extractor comprising:

a main body including a plate and four legs extending from the plate;
   four walls disposed between every two adjacent legs and extending downward from circumferential four edges of the plate;
   a slot positioned in each wall;
   a hole extending through the plate; and
   an actuator moveable in alignment with the hole.

2. The extractor as described in claim wherein the actuator comprises an elongated bar having a cross-section conformable to said hole, a block disposed at the bottom of the bar and moveable within an opening defined by said four walls and said plate, and a knob positioned at the top of the bar so that the actuator can move axially within a distance defined between the block and the plate.

3. The extractor as described in claim 1, wherein the legs downward protrude beyond the walls.

4. The extractor as described in claim 1, wherein each wall comprises an inner surface having a tapered section extending inwardly from an outer edge for facilitating reception of the cover of the socket therein.

5. The extractor as described in claim 2, wherein the block has a square shape to correspond to the cover of the socket assembly.

6. The extractor as described in claim 1, wherein a plurality of grooves are disposed on an outer surface of each wall for easy handling.

7. The extractor as described in claim 1 wherein each leg has a right angle recess at an inner corner so that said recesses associated with inner surfaces of walls define an opening to receive the IC package therein.

8. An extractor for an IC socket assembly including a cover and a housing to sandwich an IC package therebetween, said extractor comprising a main body defining a fixed opening facing downward to receive the cover of the socket assembly therein, gripping means for grasping the cover of the socket assembly within said extractor so that the cover of the socket assembly can be removed, associated with the extractor, from the housing of the socket assembly, and an actuator moveable in respect to the main body for disengaging the cover of socket assembly from the extractor; wherein the main body has a table-like shape including a plate and a plurality of walls each rigidly and integrally extending downward from an edge of the plate to define said opening therein, and said gripping means are positioned of the walls.

9. The extractor as described in claim 8, wherein said gripping means are slots positioned along the walls, respectively, and each wall has on an inner surface a tapered section extending inwardly from an outer edge.

10. The extractor as described in claim 8, wherein the main body further comprises a plurality of legs extend downward beyond the walls.

11. The extractor as described in claim 8, wherein said actuator includes a knob, an actuating block, and a bar positioned therebetween.

12. An extractor for use with an IC socket assembly which has a cover and a housing, said extractor including:

a table-like main body having a plate, and a circumferential wall fixed and integrally extending downward therefrom to define a fixed down facing opening;
   gripping means positioned along the wall for retaining the cover of the socket assembly within the opening; and an actuator vertically moveable with respect to the main body, said actuator including a block below the plate of the main body and a knob above the plate of the main body wherein a bar is positioned between said knob and said block so that a force acting on the knob transfers to the block to push out the cover of the socket therein.

13. The extractor as described in claim 2, wherein the said gripping means comprises at least a slot horizontally extending along said wall.

* * * * *